(12) United States Patent
He et al.

(10) Patent No.: US 9,166,401 B2
(45) Date of Patent: Oct. 20, 2015

(54) ELECTROSTATIC DISCHARGE PROTECTION DEVICE

(75) Inventors: Chieh-Wei He, Hsinchu (TW); Shih-Yu Wang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 809 days.

(21) Appl. No.: 13/368,745

(22) Filed: Feb. 8, 2012

(65) Prior Publication Data
US 2013/0201584 A1 Aug. 8, 2013

(51) Int. Cl.
*H02H 9/00* (2006.01)
*H02H 9/04* (2006.01)
*H01L 27/02* (2006.01)

(52) U.S. Cl.
CPC ............ *H02H 9/046* (2013.01); *H01L 27/0248* (2013.01)

(58) Field of Classification Search
CPC ............ H01L 27/0266; H01L 27/0251; H01L 27/0255; H01L 27/0262; H02H 9/046
USPC .......................................................... 361/56
See application file for complete search history.

(56) References Cited

U.S. PATENT DOCUMENTS

| | | | |
|---|---|---|---|
| 6,590,261 B2 | 7/2003 | Su et al. | |
| 7,245,466 B2 | 7/2007 | Steinhoff | |
| 7,889,470 B2 * | 2/2011 | Ker et al. | 361/56 |
| 2002/0122280 A1 * | 9/2002 | Ker et al. | 361/56 |
| 2007/0247772 A1 * | 10/2007 | Keppens et al. | 361/56 |
| 2009/0015974 A1 | 1/2009 | Wang et al. | |
| 2013/0201584 A1 * | 8/2013 | He et al. | 361/56 |

FOREIGN PATENT DOCUMENTS

| | | |
|---|---|---|
| CN | 1402346 | 3/2003 |
| CN | 1414678 | 4/2003 |
| CN | 101207121 | 6/2008 |

OTHER PUBLICATIONS

"Office Action of Taiwan Counterpart Application", issued on Oct. 6, 2014, p. 1-p. 7.
"Office Action of China Counterpart Application", issued on Feb. 28, 2015, p. 1-p. 9.

* cited by examiner

*Primary Examiner* — Ronald W Leja
(74) *Attorney, Agent, or Firm* — J.C. Patents (57) ABSTRACT

An electrostatic discharge (ESD) protection device including a modified lateral silicon-controlled rectifier (MLSCR) and a voltage control circuit is provided. The MLSCR has a first terminal, a second terminal and a control terminal connected to a first P+-type doped region, where the first terminal and the second terminal are electrically connected to a first line and a second line, respectively. The voltage control circuit is electrically connected to the first line, the second line and the control terminal. When an electrostatic pulse is appeared on the first line, the voltage control circuit provides a current path from the first line to the control terminal. When an input signal is supplied to the first line, the voltage control circuit receives a power voltage, and stops providing the current path according to the power voltage.

5 Claims, 5 Drawing Sheets

ELECTROSTATIC DISCHARGE PROTECTION DEVICE

BACKGROUND OF THE INVENTION

1. Field of the Invention

The invention relates to an electrostatic discharge (ESD) protection device. Particularly, the invention relates to an ESD protection device having a modified lateral silicon-controlled rectifier (MLSCR).

2. Description of Related Art

Electrostatic discharge (ESD) is generally a main reason to cause electrostatic overstress or permanent damage of an integrated circuit (IC), so that an ESD protection device is generally added to the IC to prevent ESD damage. In recent years, a modified lateral silicon-controlled rectifier (MLSCR) has become a basic component in design of the ESD protection device. However, the MLSCR has several shortages in operation that have to be overcome.

For example, a trigger voltage and a holding voltage of the MLSCR are generally too high or too low. Moreover, the MLSCR is liable to have a latch-up effect. In addition, in control of a plurality of the MLSCRs, the MLSCRs are generally unable to be simultaneously turned on, which may cause a non-uniform turn-on phenomenon. Moreover, a magnitude of the trigger voltage may influence a turn-on speed of the MLSCR.

Therefore, various manufactures are dedicated to resolve the above problems, so as to enhance protection capability of the ESD protection device.

SUMMARY OF THE INVENTION

The invention is directed to an electrostatic discharge (ESD) protection device, in which a voltage control circuit is used to provide a current path from a control terminal of a modified lateral silicon-controlled rectifier (MLSCR) to a first line, so as to enhance a turn-on speed of the MLSCR.

The invention is directed to an ESD protection device, in which a voltage control circuit is used to provide a current path from a control terminal of an MLSCR to a second line, so as to avoid a non-uniform turn-on phenomenon.

The invention provides an electrostatic discharge (ESD) protection device including a modified lateral silicon-controlled rectifier (MLSCR) and a voltage control circuit. The MLSCR has a first terminal, a second terminal and a control terminal connected to a first P+-type doped region, where the first terminal and the second terminal are electrically connected to a first line and a second line, respectively. The voltage control circuit is electrically connected to the first line, the second line and the control terminal. When an electrostatic pulse is appeared on the first line, the voltage control circuit provides a current path from the first line to the control terminal.

In an embodiment of the invention, when an input signal is supplied to the first line, the voltage control circuit receives a power voltage, and stops providing the current path according to the power voltage.

In an embodiment of the invention, the voltage control circuit includes a control unit and a switch unit. The control unit is electrically connected to the first line and the second line, and has an input terminal. When the electrostatic pulse is appeared on the first line, the input terminal of the control unit is floating, and the control unit generates a first control signal in response to the electrostatic pulse. When the input signal is supplied to the first line, the input terminal of the control unit receives the power voltage, and generates a second control signal. The switch unit is electrically connected to the first line and the control terminal. Moreover, the switch unit provides the current path according to the first control signal, and stops providing the current path according to the second control signal.

The invention provides an ESD protection device including an MLSCR and a voltage control circuit. The MLSCR has a first terminal, a second terminal and a control terminal connected to a first N+-type doped region, where the first terminal and the second terminal are electrically connected to a first line and a second line, respectively. The voltage control circuit is electrically connected to the first line, the second line and the control terminal. When an electrostatic pulse is appeared on the first line, the voltage control circuit provides a current path from the second line to the control terminal.

According to the above descriptions, the voltage control circuit is used to provide the current path from the control terminal of the MLSCR to the first line or the second line, so as to decrease a trigger voltage of the MLSCR. In this way, generation of a non-uniform turn-on phenomenon is avoided, and a turn-on speed of the MLSCR is enhanced. On the other hand, when the voltage control circuit cannot provide the current path, the trigger voltage of the MLSCR is accordingly increased. In this way, a latch-up effect of the MLSCR is avoided.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
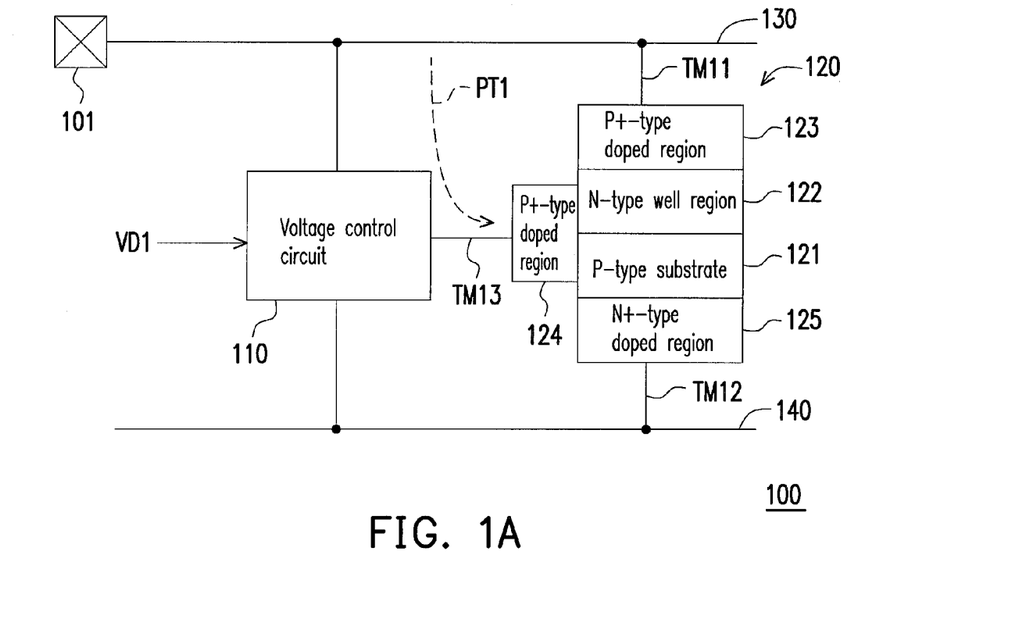
FIG. 1A is a schematic diagram of an electrostatic discharge (ESD) protection device according to an embodiment of the invention.

FIG. 1A is a schematic diagram of an electrostatic discharge (ESD) protection device according to an embodiment of the invention. Referring to FIG. 1A, the ESD protection device 100 includes a voltage control circuit 110 and a modified lateral silicon-controlled rectifier (MLSCR) 120. The MLSCR 120 has a first terminal TM11, a second terminal TM12 and a control terminal TM13. Moreover, FIG. 1B is a cross-sectional view of a layout of the MLSCR according to an embodiment of the invention.

Figure 1B:
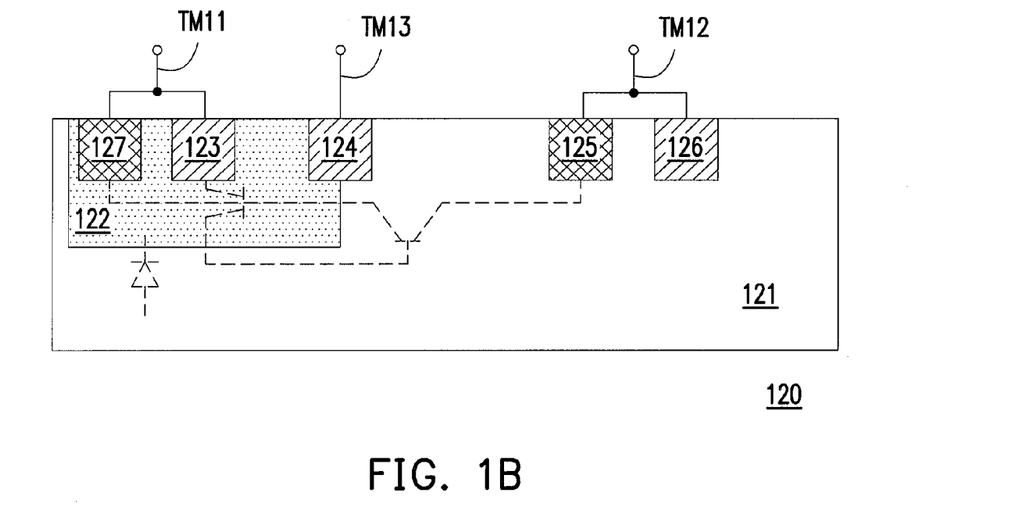
FIG. 1B is a cross-sectional view of a layout of a modified lateral silicon-controlled rectifier (MLSCR) according to an embodiment of the invention.

Referring to FIG. 1B, the MLSCR 120 includes a P-type substrate 121, an N-type well region 122, a P+-type doped region 123, a P+-type doped region 124, an N+-type doped region 125, a P+-type doped region 126 and an N+-type doped region 127. The N-type well region 122 is disposed in the P-type substrate 121. The P+-type doped region 123 and the N+-type doped region 127 are disposed in the N-type well region 122, and are electrically connected to the first terminal TM11. The P+-type doped region 124 is partially disposed in the N-type well region 122, and is electrically connected to the control terminal TM13. The N+-type doped region 125 and the P+-type doped region 126 are disposed in the P-type substrate 121, and are electrically connected to the second terminal TM12.

In view of a layout structure, the P+-type doped region 123, the N-type well region 122 and the P-type substrate 121 form a vertical PNP transistor. The N-type well region 122, the P-type substrate 121 and the N+-type doped region 125 form a horizontal NPN transistor. The N-type well region 122 and the P-type substrate 121 form an inverse diode. In other words, the P+-type doped region 123, the N-type well region 122, the P-type substrate 121 and the N+-type doped region 125 form a PNPN semiconductor structure, which is a main structure of the MLSCR 120. Moreover, in order to decrease a breakdown voltage of the MLSCR 120, the P+-type doped region 124 is additionally configured in the PNPN semiconductor structure. Here, for simplicity's sake, only the P+-type doped region 123, the N-type well region 122, the P-type substrate 121 and the N+-type doped region 125 that form the PNPN semiconductor structure and the additionally configured P+-type doped region 124 are illustrated in FIG. 1A.

Referring to FIG. 1A, the first terminal TM11 of the MLSCR 120 is electrically connected to a first line 130, and the second terminal TM12 of the MLSCR 120 is electrically connected to a second line 140. The voltage control circuit 110 is electrically connected to the first line 130, the second line 140 and the control terminal TM13 of the MLSCR 120.

In an actual application, the ESD protection device 100 is mainly used to guide an electrostatic pulse come from a pad 101, so as to prevent the electrostatic pulse from damaging an integrated circuit (not shown). Here, when an ESD event occurs, the electrostatic pulse is input through the pad 101 and is appeared on the first line 130. Now, the voltage control circuit 110 provides a current path PT1 from the first line 130 to the control terminal TM13 of the MLSCR 120. Therefore, a current from the first line 130 flows to the P+-type doped region 124, so as to increase a voltage level of the P-type substrate 121. In this way, the P-type substrate 121 and the N+-type doped region 125 are biased under a forward bias, so that a trigger voltage of the MLSCR 120 is decreased. Therefore, the MLSCR 120 can be quickly turned on to guide the electrostatic pulse to the second line 140.

Moreover, when the integrated circuit normally operates, an input signal is supplied to the first line 130 through the pad 101. Now, the voltage control circuit 110 receives a power voltage VD1, and stops providing the current path PT1 according to the power voltage VD1. As the current path PT1 disappears, the trigger voltage of the MLSCR 120 is pulled up to a high voltage level, so as to ensure a turn-off state of the MLSCR 120.

Figure 2:
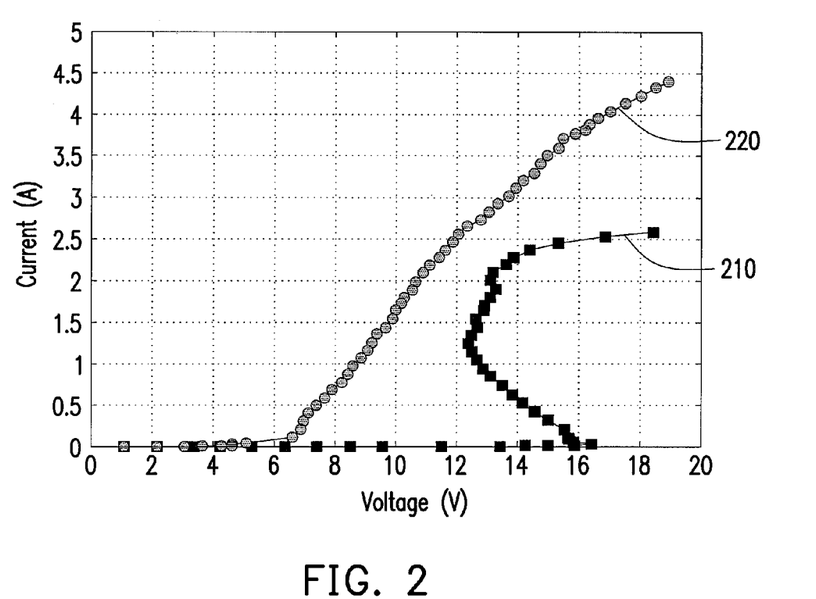
FIG. 2 is a characteristic curve diagram of an MLSCR according to an embodiment of the invention.

For example, FIG. 2 is a characteristic curve diagram of the MLSCR according to an embodiment of the invention, in which a curve 220 is a voltage-current characteristic curve of the MLSCR 120 in case that the current path PT1 is provided, and a curve 210 is a voltage-current characteristic curve of the MLSCR 120 in case that the current path PT1 is not provided. Shown as the curve 220, when the current path PT1 is provided, the trigger voltage is pulled down to about 6.3 volts (V). Moreover, shown as the curve 210, when the current path PT1 is not provided, the trigger voltage is pulled up to about 16.2 V.

In other words, when the electrostatic pulse is appeared on the first line 130, the voltage control circuit 110 provides the current path PT1 to decrease the trigger voltage of the MLSCR 120. Now, as the trigger voltage decreases, a non-uniform turn-on phenomenon is avoided, and a turn-on speed of the MLSCR 120 is enhanced. On the other hand, when the input signal is supplied to the first line 130, i.e. when the integrated circuit normally operates, the voltage control circuit 110 stops providing the current path PT1 to increase the trigger voltage of the MLSCR 120. Now, as the trigger voltage is increased, conduction of the MLSCR 120 due to external noise or transient over-voltage is avoided, so as to avoid a latch-up effect of the MLSCR 120.

Figure 3:
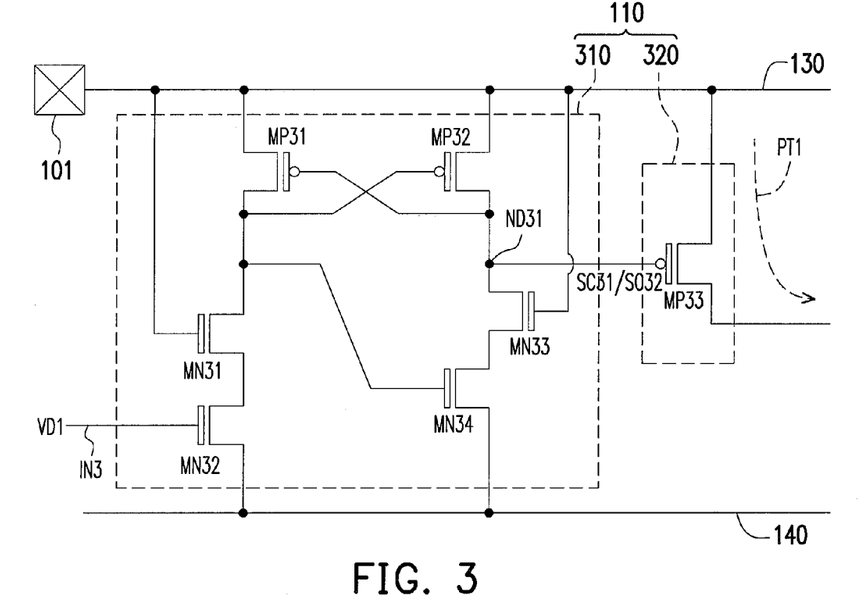
FIG. 3 is a circuit schematic diagram of a voltage control circuit according to an embodiment of the invention.

To fully convey the spirit of the invention to those skilled in the art, a detailed structure of the voltage control circuit 110 is described below. FIG. 3 is a circuit schematic diagram of the voltage control circuit according to an embodiment of the invention. Referring to FIG. 3, the voltage control circuit 110 includes a control unit 310 and a switch unit 320. The control unit 310 has an input terminal IN3, and the control unit 310 is electrically connected to the first line 130 and the second line 140. The switch unit 320 is electrically connected to the first line 130 and the control terminal TM13 of the MLSCR 120.

Further, the control unit 310 includes P-type transistors MP31-MP32 and N-type transistors MN31-MN34, and the switch unit 320 is composed of a P-type transistor MP33. Sources of the P-type transistors MP31-MP32 are electrically connected to the first line 130. A gate of the P-type transistor MP32 is electrically connected to a drain of the P-type transistor MP31, and a drain of the P-type transistor MP32 is electrically connected to the switch unit 320 and a gate of the P-type transistor MP31. A drain of the N-type transistor MN31 is electrically connected to the drain of the P-type transistor MP31, and a gate of the N-type transistor MN31 is electrically connected to the first line 130. A drain of the N-type transistor MN32 is electrically connected to a source of the N-type transistor MN31, a gate of the N-type transistor MN32 is the input terminal IN3 of the control unit 310, and a source of the N-type transistor MN32 is electrically connected to the second line 140.

A drain of the N-type transistor MN33 is electrically connected to the drain of the P-type transistor MP32, and a gate of the N-type transistor MN33 is electrically connected to the first line 130. A drain of the N-type transistor MN34 is electrically connected to a source of the N-type transistor MN33, a gate of the N-type transistor MN34 is electrically connected to the drain of the P-type transistor MP31, and a source of the N-type transistor MN34 is electrically connected to the second line 140. A source of the P-type transistor MP33 is electrically connected to the first line 130, a gate of the P-type transistor MP33 receives a first control signal SC31 or a second control signal SC32, and a drain of the P-type transistor MP33 is electrically connected to the control terminal TM13 of the MLSCR 120.

In operation, when the electrostatic pulse is appeared on the first line 130, the input terminal IN3 of the control unit 310 is floating, and now the N-type transistor MN32 is not turned on. On the other hand, the electrostatic pulse is coupled to the gate of the N-type transistor MN34 through a parasitic capacitance to turn on the N-type transistor MN34. Moreover, the gate of the N-type transistor MN33 receives the electrostatic pulse, so that the N-type transistor MN33 is turned on. As the N-type transistor MN33 and the N-type transistor MN34 are turned on, a voltage of a node ND31 is pulled down to a low voltage level (for example, a ground level), and the P-type transistor MP31 is turned on.

Moreover, as the P-type transistor MP31 is turned on, the P-type transistor MP32 is latched to a turn-off state. Moreover, since the voltage of the node ND31 is pulled down to the low voltage level, the control unit 310 generates a low level signal, i.e. the first control signal SC31. Therefore, the P-type transistor MP33 of the switch unit 320 is turned on in response to the first control signal SC31 (i.e. the low level signal), so as to form the current path PT1.

On the other hand, when the input signal is supplied to the first line 130, i.e. when the integrated circuit normally operates, the input terminal IN3 of the control unit 310 receives the power voltage VD1, and now the N-type transistor MN32 is turned on. Moreover, the gate of the N-type transistor MN31 receives the input signal, so that the N-type transistor MN31 is turned on. As the N-type transistor MN31 and the N-type transistor MN32 are turned on, the gate of the N-type transistor MN34 and the gate of the P-type transistor MP32 receive a low level signal, so that the N-type transistor MN34 is in the turn-off state, and the P-type transistor MP32 is turned on.

Moreover, as the P-type transistor MP32 is turned on, the P-type transistor MP31 is latched to the turn-off state. On the other hand, the voltage of the node ND31 is pulled up to a high voltage level similar to that of the input signal as the P-type transistor MP 32 is turned on. Therefore, the control unit 310 generates a high level signal, i.e. the second control signal SC32. Therefore, the P-type transistor MP33 of the switch unit 320 is turned off in response to the second control signal SC32 (i.e. the high level signal), and the current path PT1 is not formed.

In other words, when the electrostatic pulse is appeared on the first line 130, the input terminal IN3 of the control unit 310 is floating. Now, the control unit 310 generates the first control signal SC31 in response to the electrostatic pulse, and the switch unit 320 provides the current path PT1 according to the first control signal SC31. Comparatively, when the input signal is supplied to the first line 130, i.e. when the integrated circuit normally operates, the input terminal IN3 of the control unit 310 receives the power voltage VD1. Now, the control unit 310 generates the second control signal SC32 according to the power voltage VD1, and the switch unit 320 stops providing the current path PT1 according to the second control signal SC32.

Figure 4:
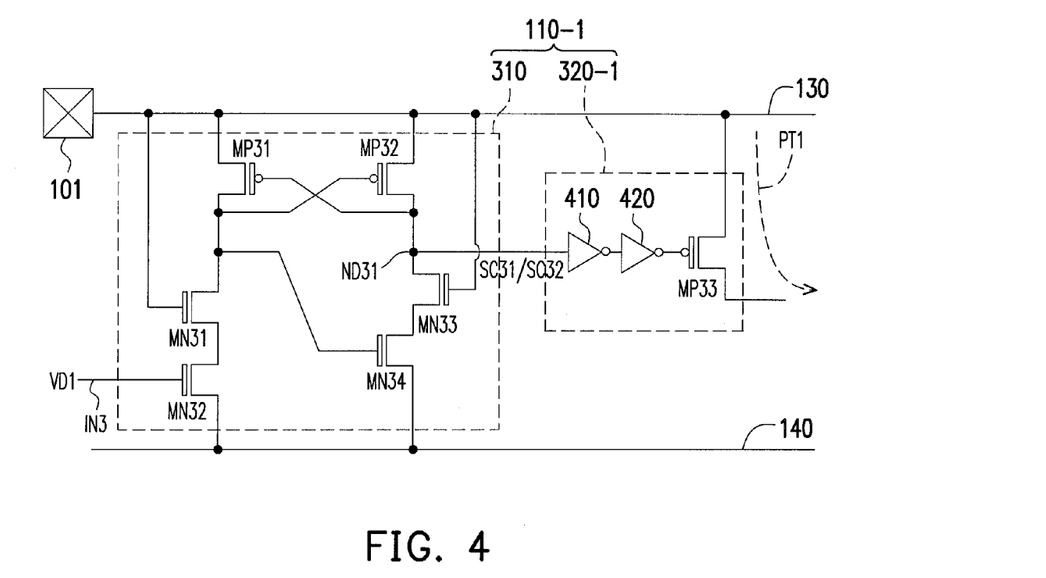
FIG. 4 and FIG. 5 are respectively circuit schematic diagrams of a voltage control circuit according to another embodiment of the invention.
Figure 5:
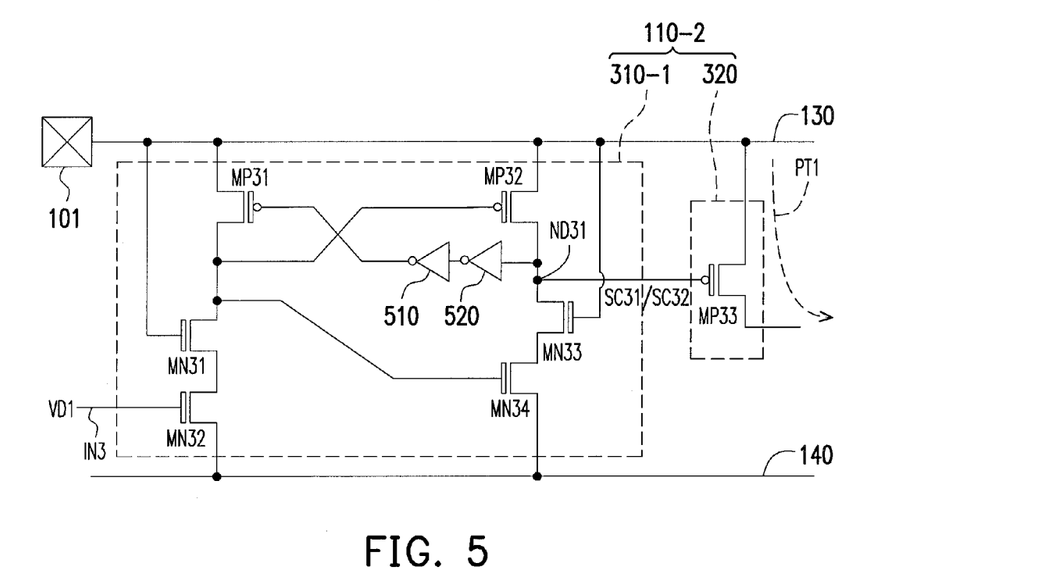

Although an implementation of the voltage control circuit 110 is provided in the embodiment of FIG. 3, the invention is not limited thereto. For example, FIG. 4 and FIG. 5 are respectively circuit schematic diagrams of a voltage control circuit according to another embodiment of the invention. Elements with the same or similar functions and structures in FIG. 3 to FIG. 5 are represented by the same reference numerals or names.

Referring to FIG. 4, a voltage control circuit 110-1 includes the control unit 310 and a switch unit 320-1. A circuit structure and operation of the control unit 310 in the voltage control circuit 110-1 are the same to that of the control circuit 310 in the voltage control circuit 110 of FIG. 3, so that descriptions thereof are not repeated.

A main difference between the present embodiment and the embodiment of FIG. 3 is that the switch unit 320-1 of the present embodiment includes an inverter 410, an inverter 420 and the P-type transistor MP33. Here, an input terminal of the inverter 410 receives the first control signal SC31 or the second signal SC32. An input terminal of the inverter 420 is electrically connected to an output terminal of the inverter 410. The source of the P-type transistor MP33 is electrically connected to the first line 130, the gate of the P-type transistor MP33 is electrically connected to an output terminal of the inverter 420, and the drain of the P-type transistor MP33 is electrically connected to the control terminal TM13 of the MLSCR 120.

In operation, when the electrostatic pulse is appeared on the first line 130, the control unit 310 generates the first control signal SC31 (for example, the low level signal) to the input terminal of the inverter 410. Now, the first control signal SC31 is inverted by twice by the inverter 410 and the inverter 420, so that a signal sent to the gate of the P-type transistor MP33 is still the low level signal. In this way, the P-type transistor MP33 is turned on according to the low level signal, so as to form the current path PT1.

When the input signal is supplied to the first line 130, i.e. when the integrated circuit normally operates, the control unit 310 generates the second control signal SC32 (for example, the high level signal) to the input terminal of the inverter 410. Similarly, the second control signal SC32 is inverted by twice by the inverter 410 and the inverter 420, so that a signal sent to the gate of the P-type transistor MP33 is still the high level signal. In this way, the P-type transistor MP33 is turned off according to the high level signal, and the current path PT1 is not formed.

Referring to FIG. 5, a voltage control circuit 110-2 includes a control unit 310-1 and the switch unit 320. A circuit structure and operation of the switch unit 320 in the voltage control circuit 110-2 are the same to that of the switch unit 320 in the voltage control circuit 110 of FIG. 3, so that descriptions thereof are not repeated.

A main difference between the present embodiment and the embodiment of FIG. 3 is that the control unit 310-1 includes the P-type transistors MP31-MP32, the N-type transistors MN31-MN34, an inverter 510 and an inverter 520. The sources of the P-type transistors MP31-MP32 are electrically connected to the first line 130. The gate of the P-type transistor MP32 is electrically connected to the drain of the P-type transistor MP31. An input terminal of the inverter 510 is electrically connected to the drain of the P-type transistor MP32. An input terminal of the inverter 520 is electrically connected to an output terminal of the inverter 510, and an output terminal of the inverter 520 is electrically connected to the gate of the P-type transistor MP31. Coupling methods of the N-type transistors MN31-MN34 are similar to that of the embodiment of FIG. 3, and details thereof are not repeated.

In operation, when the electrostatic pulse is appeared on the first line 130, the N-type transistor MN31, the N-type transistor MN33 and the N-type transistor MN34 are turned on in response to the electrostatic pulse, and the N-type transistor MN32 is not turned on due to floating of the input terminal IN3. In this way, the voltage of the node ND31 is pulled down to the low voltage level (for example, the ground level), and the control unit 310 generates the low level signal, i.e. the first control signal SC31. On the other hand, the low level signal is inverted by twice by the inverter 510 and the inverter 520, so that the signal transmitted to the gate of the P-type transistor MP31 is still the low level signal. Therefore, the P-type transistor MP31 is turned on according to the low level signal, and the P-type transistor MP32 is latched to the turn-off state.

When the input signal is supplied to the first line 130, i.e. when the integrated circuit normally operates, the N-type transistor MN32 is turned on according to the power voltage VD1, and the N-type transistors MN31 and MN33 are turned on according to the input signal come from the pad 101. In this way, the gate of the P-type transistor MP32 and the gate of the N-type transistor MN34 receive the low level signal from the second line 140, so that the P-type transistor MP32 is turned on, and the N-type transistor MN34 is not turned on. Moreover, the voltage of the node ND31 is pulled up to the high voltage level similar to that of the input signal as the P-type transistor MP32 is turned on. Now, the control unit 310 generates the high level signal, i.e. the second control signal SC32. Moreover, the high level signal is inverted by twice by the inverter 510 and the inverter 520, so that the signal transmitted to the gate of the P-type transistor MP31 is still the high level signal. Therefore, the P-type transistor MP31 is latched to the turn-off state according to the high level signal.

Figure 6A:
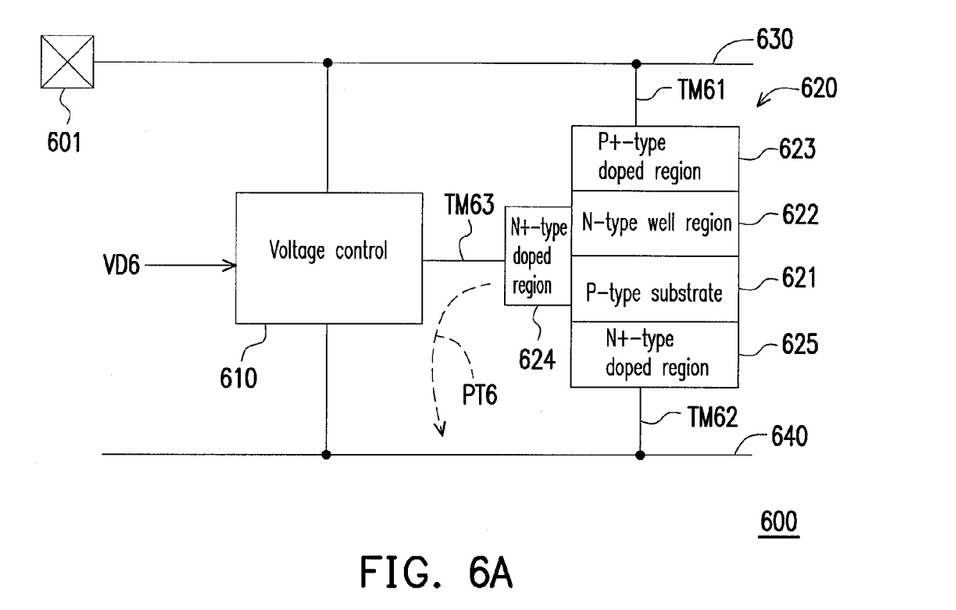
FIG. 6A is a schematic diagram of an ESD protection device according to another embodiment of the invention.

FIG. 6A is a schematic diagram of an ESD protection device according to another embodiment of the invention. Referring to FIG. 6A, the ESD protection device 600 includes a voltage control circuit 610 and an MLSCR 620. The MLSCR 620 has a first terminal TM61, a second terminal TM62 and a control terminal TM63. Moreover, FIG. 6B is a cross-sectional view of a layout of the MLSCR according to another embodiment of the invention.

Figure 6B:
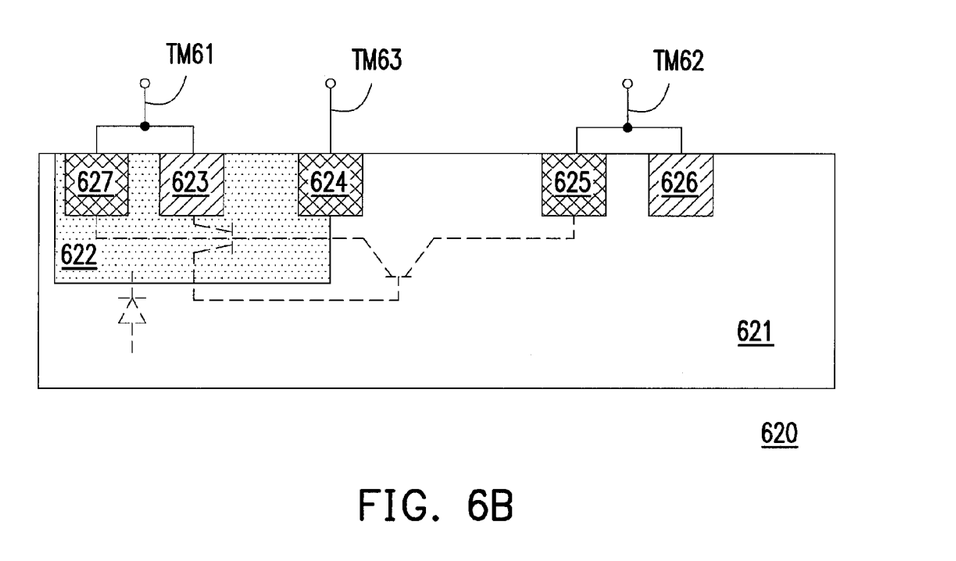
FIG. 6B is a cross-sectional view of a layout of an MLSCR according to another embodiment of the invention.

Referring to FIG. 6B, the MLSCR 620 includes a P-type substrate 621, an N-type well region 622, a P+-type doped region 623, an N+-type doped region 624, an N+-type doped region 625, a P+-type doped region 626 and an N+-type doped region 627. The N-type well region 622 is disposed in the P-type substrate 621. The P+-type doped region 623 and the N+-type doped region 627 are disposed in the N-type well region 622, and are electrically connected to the first terminal TM61. The N+-type doped region 624 is partially disposed in the N-type well region 622, and is electrically connected to the control terminal TM63. The N+-type doped region 625 and the P+-type doped region 626 are disposed in the P-type substrate 621, and are electrically connected to the second terminal TM62.

In view of a layout structure, the P+-type doped region 623, the N-type well region 622 and the P-type substrate 621 form a vertical PNP transistor. The N-type well region 622, the P-type substrate 621 and the N+-type doped region 625 form a horizontal NPN transistor. The N-type well region 622 and the P-type substrate 621 form an inverse diode. In other words, the P+-type doped region 623, the N-type well region 622, the P-type substrate 621 and the N+-type doped region 625 form a PNPN semiconductor structure, which is a main structure of the MLSCR 620. Moreover, in order to decrease a breakdown voltage of the MLSCR 620, the N+-type doped region 624 is additionally configured in the PNPN semiconductor structure. Here, for simplicity's sake, only the P+-type doped region 623, the N-type well region 622, the P-type substrate 621 and the N+-type doped region 625 that form the PNPN semiconductor structure and the additionally configured N+-type doped region 624 are illustrated in FIG. 6A.

Referring to FIG. 6A, the first terminal TM61 of the MLSCR 620 is electrically connected to a first line 630, and the second terminal TM62 of the MLSCR 620 is electrically connected to a second line 640. The voltage control circuit 610 is electrically connected to the first line 630, the second line 640 and the control terminal TM63 of the MLSCR 620.

In an actual application, the ESD protection device 600 is mainly used to guide an electrostatic pulse come from a pad 601, so as to prevent the electrostatic pulse from damaging an integrated circuit (not shown). Here, when an ESD event occurs, the electrostatic pulse is input through the pad 601 and is appeared on the first line 630. Now, the voltage control circuit 610 provides a current path PT6 from the second line 640 to the control terminal TM63 of the MLSCR 620. Therefore, a current from the N+-type doped region 624 flows to the second line 640 through the current path PT6, so as to decrease a voltage level of the N+-type doped region 624 and N-type well region 622. In this way, the P+-type doped region 623 and the N-type well region 622 are biased under a forward bias, so that a trigger voltage of the MLSCR 620 is decreased. Therefore, the MLSCR 620 can be quickly turned on to guide the electrostatic pulse to the second line 640.

Moreover, when the integrated circuit normally operates, an input signal is supplied to the first line 630 through the pad 601. Now, the voltage control circuit 610 receives a power voltage VD6, and stops providing the current path PT6 according to the power voltage VD6. As the current path PT6 disappears, the trigger voltage of the MLSCR 620 is pulled up to a high voltage level, so as to ensure a turn-off state of the MLSCR 620.

In other words, when the electrostatic pulse is appeared on the first line 630, the voltage control circuit 610 provides the current path PT6 to decrease the trigger voltage of the MLSCR 620. On the other hand, when the input signal is supplied to the first line 630, i.e. when the integrated circuit normally operates, the voltage control circuit 610 stops providing the current path PT6 to increase the trigger voltage of the MLSCR 620. In order to fully convey the spirit of the invention to those skilled in the art, a detailed structure of the voltage control circuit 610 is described below.

Figure 7:
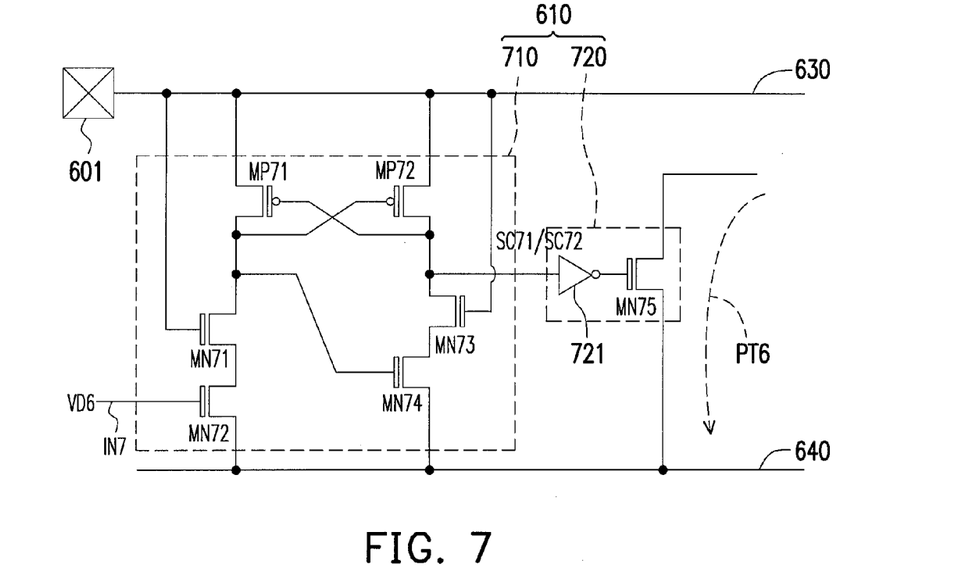
FIG. 7 is a circuit schematic diagram of a voltage control circuit according to still another embodiment of the invention.

FIG. 7 is a circuit schematic diagram of the voltage control circuit according to still another embodiment of the invention. Referring to FIG. 7, the voltage control circuit 610 includes a control unit 710 and a switch unit 720. The control unit 710 has an input terminal IN7, and includes P-type transistors MP71-MP72 and N-type transistors MN71-MN74.

Here, coupling methods of the P-type transistors MP71-MP72 and the N-type transistors MN71-MN74 are similar to the coupling methods of the P-type transistors MP31-MP32 and the N-type transistors MN31-MN34 of the embodiment of FIG. 3, so that details thereof are not repeated. The switch unit 720 includes an inverter 721 and an N-type transistor MN75. An input terminal of the inverter 721 receives a first control signal SC71 or a second control signal SC72. A drain of the N-type transistor MN75 is electrically connected to the control terminal TM63, a gate of the N-type transistor MN75 is electrically connected to an output terminal of the inverter 721, and a source of the N-type transistor MN75 is electrically connected to the second line 640.

In operation, since a circuit structure of the control unit 710 of FIG. 7 is the same to that of the control unit 310 of FIG. 3, similar to the embodiment of FIG. 3, when the electrostatic pulse is appeared on the first line 630, the control unit 710 generates the low level signal, i.e. the first control signal SC71. When the input signal is supplied to the first line 630, i.e. when the integrated circuit normally operates, the control unit 310 generates the high level signal, i.e. the second control signal SC32. Detailed operations of the control unit 710 of FIG. 7 are not repeated.

When the switch unit 720 receives the first control signal SC71 (the low level signal), the inverter 721 inverts the first control signal SC71 to generate a high level signal to the gate of the N-type transistor MN75. In this way, the N-type transistor MN75 is turned on to form the current path PT6. Comparatively, when the switch unit 720 receives the second control signal SC72 (the high level signal), the inverter 721 generates a low level signal. In this way, the N-type transistor MN75 is not turned on, and the current path PT6 is not formed.

Figure 8:
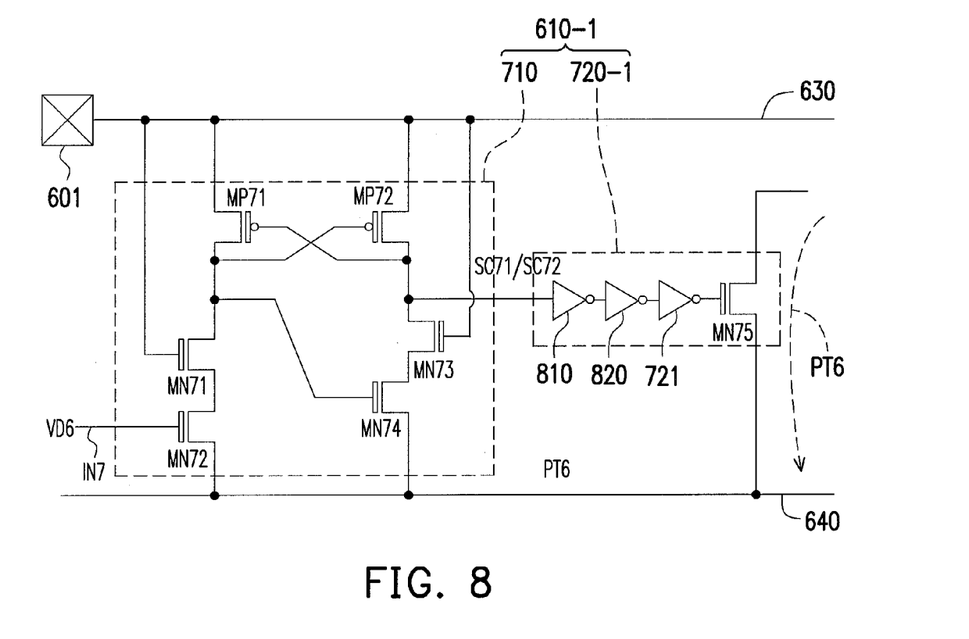
FIG. 8 is a circuit schematic diagram of a voltage control circuit according to yet another embodiment of the invention.

Although an implementation of the voltage control circuit 610 is provided in the embodiment of FIG. 7, the invention is not limited thereto. For example, FIG. 8 is a circuit schematic diagram of a voltage control circuit according to yet another embodiment of the invention. Elements with the same or similar functions and structures in FIG. 7 and FIG. 8 are represented by the same reference numerals or names.

Referring to FIG. 8, a voltage control circuit 610-1 includes the control unit 710 and a switch unit 720-1. A circuit structure and operation of the control unit 710 of FIG. 8 are the same to that of the control circuit 710 of FIG. 7, so that descriptions thereof are not repeated. Moreover, compared to the switch unit 720 of FIG. 7, the switch unit 720-1 of FIG. 8 further includes two inverters 810 and 820. The inverter 810 and the inverter 820 are connected in series between the control unit 710 and the inverter 720. In this way, the first control signal SC71 or the second control signal SC72 output by the control unit 710 is inverted by twice and transmitted to the inverter 721. In other words, the signals received by the inverter 721 and the inverter 820 are the same, so that operations of the inverter 721 and the N-type transistor MN75 of FIG. 8 are the same to that of the embodiment of FIG. 7.

In summary, the voltage control circuit is used to provide the current path from the control terminal of the MLSCR to the first line or the second line, so as to decrease the trigger voltage of the MLSCR. In this way, as the rigger voltage decreases, generation of a non-uniform turn-on phenomenon is avoided, and a turn-on speed of the MLSCR is enhanced. On the other hand, when the voltage control circuit cannot provide the current path, the trigger voltage of the MLSCR is accordingly increased. In this way, as the trigger voltage increases, conduction of the MLSCR due to external noise or transient over-voltage is avoided, so as to avoid a latch-up effect of the MLSCR.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electrostatic discharge (ESD) protection device, comprising:
   a modified lateral silicon-controlled rectifier, having a first terminal, a second terminal and a control terminal connected to a first P+-type doped region, wherein the first terminal and the second terminal are electrically connected to a first line and a second line, respectively; and
   a voltage control circuit, electrically connected to the first line, the second line and the control terminal, wherein when an electrostatic pulse is appeared on the first line, the voltage control circuit provides a current path from the first line to the control terminal, when an input signal is supplied to the first line, the voltage control circuit receives a power voltage and stops providing the current path according to the power voltage, and the voltage control circuit comprises:
   a control unit, electrically connected to the first line and the second line, and having an input terminal, wherein when the electrostatic pulse is appeared on the first line, the input terminal of the control unit is floating, and the control unit generates a first control signal in response to the electrostatic pulse, and when the input signal is supplied to the first line, the input terminal of the control unit receives the power voltage and generates a second control signal; and
   a switch unit, electrically connected to the first line and the control terminal, wherein the switch unit provides the current path according to the first control signal, and stops providing the current path according to the second control signal,
   wherein the control unit comprises:
   a first P-type transistor, having a source electrically connected to the first line;
   a second P-type transistor, having a source electrically connected to the first line, a gate electrically connected to a drain of the first P-type transistor, and a drain electrically connected to the switch unit and a gate of the first P-type transistor;
   a first N-type transistor, having a drain electrically connected to the drain of the first P-type transistor, and a gate electrically connected to the first line;
   a second N-type transistor, having a drain electrically connected to a source of the first N-type transistor, a gate serving as the input terminal of the control unit, and a source electrically connected to the second line;
   a third N-type transistor, having a drain electrically connected to the drain of the second P-type transistor, and a gate electrically connected to the first line; and
   a fourth N-type transistor, having a drain electrically connected to a source of the third N-type transistor, a gate electrically connected to the drain of the first P-type transistor, and a source electrically connected to the second line.

2. The ESD protection device as claimed in claim 1, wherein the switch unit is composed of a third P-type transistor, a source of the third P-type transistor is electrically connected to the first line, a gate of the third P-type transistor receives the first control signal or the second control signal, and a drain of the third P-type transistor is electrically connected to the control terminal.

3. The ESD protection device as claimed in claim 1, wherein the switch unit comprises:
   a first inverter, having an input terminal receiving the first control signal or the second control signal;
   a second inverter, having an input terminal electrically connected to an output terminal of the first inverter; and
   a third P-type transistor, having a source electrically connected to the first line, a gate electrically connected to an output terminal of the second inverter, and a drain electrically connected to the control terminal.

4. The ESD protection device as claimed in claim 1, wherein the modified lateral silicon-controlled rectifier comprises:
   a P-type substrate;
   an N-type well region, disposed in the P-type substrate, wherein the first P+-type doped region is partially disposed in the N-type well region;
   a second P+-type doped region, disposed in the N-type well region, and electrically connected to the first terminal;
   a first N+-type doped region, disposed in the P-type substrate, and electrically connected to the second terminal; and
   a third P+-type doped region, disposed in the P-type substrate, and electrically connected to the second terminal.

5. An electrostatic discharge (ESD) protection device, comprising:
   a modified lateral silicon-controlled rectifier, having a first terminal, a second terminal and a control terminal connected to a first P+-type doped region, wherein the first terminal and the second terminal are electrically connected to a first line and a second line, respectively; and a voltage control circuit, electrically connected to the first line, the second line and the control terminal, wherein when an electrostatic pulse is appeared on the first line, the voltage control circuit provides a current path from the first line to the control terminal, when an input signal is supplied to the first line, the voltage control circuit receives a power voltage and stops providing the current path according to the power voltage, and the voltage control circuit comprises:

a control unit, electrically connected to the first line and the second line, and having an input terminal, wherein when the electrostatic pulse is appeared on the first line, the input terminal of the control unit is floating, and the control unit generates a first control signal in response to the electrostatic pulse, and when the input signal is supplied to the first line, the input terminal of the control unit receives the power voltage and generates a second control signal; and a switch unit, electrically connected to the first line and the control terminal, wherein the switch unit provides the current path according to the first control signal, and stops providing the current path according to the second control signal, wherein the control unit comprises:

a first P-type transistor, having a source electrically connected to the first line;

a second P-type transistor, having a source electrically connected to the first line, and a gate electrically connected to a drain of the first P-type transistor;

a first inverter, having an input terminal electrically connected to a drain of the second P-type transistor;

a second inverter, having an input terminal electrically connected to an output terminal of the first inverter, and an output terminal electrically connected to a gate of the first P-type transistor;

a first N-type transistor, having a drain electrically connected to the drain of the first P-type transistor, and a gate electrically connected to the first line;

a second N-type transistor, having a drain electrically connected to a source of the first N-type transistor, a gate serving as the input terminal of the control unit, and a source electrically connected to the second line;

a third N-type transistor, having a drain electrically connected to the drain of the second P-type transistor, and a gate electrically connected to the first line; and a fourth N-type transistor, having a drain electrically connected to a source of the third N-type transistor, a gate electrically connected to the drain of the first P-type transistor, and a source electrically connected to the second line.

* * * * *